(12) United States Patent
Avery

(10) Patent No.: US 6,594,132 B1
(45) Date of Patent: Jul. 15, 2003

(54) STACKED SILICON CONTROLLED RECTIFIERS FOR ESD PROTECTION

(75) Inventor: Leslie Ronald Avery, Flemington, NJ (US)

(73) Assignee: Sarnoff Corporation, Princeton, NJ (US)

( * ) Notice: Subject to any disclaimer, the term of this patent is extended or adjusted under 35 U.S.C. 154(b) by 246 days.

(21) Appl. No.: 09/625,804

(22) Filed: Jul. 26, 2000

Related U.S. Application Data

(63) Continuation-in-part of application No. 09/572,172, filed on May 17, 2000.

(51) Int. Cl.[7] .................................................. H02H 3/22
(52) U.S. Cl. ...................................................... 361/111
(58) Field of Search ............................... 361/111, 91.1, 361/100, 56; 257/162

(56) References Cited

U.S. PATENT DOCUMENTS

| | | | |
|---|---|---|---|
| 4,130,767 A | * 12/1978 | Okuhara et al. | ............ 307/252 |
| 4,567,500 A | 1/1986 | Avery | |
| 5,072,273 A | 12/1991 | Avery | |
| 5,274,262 A | 12/1993 | Avery | |
| 5,343,053 A | 8/1994 | Avery | |
| 5,400,202 A | * 3/1995 | Metz et al. | .................... 361/56 |
| 5,572,394 A | * 11/1996 | Ker et al. | ...................... 361/56 |
| 5,615,074 A | 3/1997 | Avery | |
| 5,663,860 A | * 9/1997 | Swonger | ...................... 361/56 |
| 5,932,916 A | 8/1999 | Jung | |
| 5,959,332 A | * 9/1999 | Ravanelli et al. | ........... 257/360 |
| 5,986,307 A | 11/1999 | Yu | |
| 6,016,002 A | * 1/2000 | Chen et al. | ................. 257/546 |

* cited by examiner

Primary Examiner—Brian Sircus
Assistant Examiner—Z. Kitov
(74) Attorney, Agent, or Firm—William J. Burke

(57) ABSTRACT

An exemplary embodiment of the invention eliminates the common P-Well in a stacked SCR structure by providing isolated P-Wells. This embodiment is particularly advantageous in electrostatic protection devices (ESD) formed from a plurality of silicon controlled rectifiers connected in series. The isolated P-Wells are formed, in part, by a high voltage CMOS process incorporating a relatively heavily doped retrograde buried N layer that enables the formation of junction isolated P-Wells surrounded by an N-Well. The complete isolation of the P-Well prevents the normal P-Well to P substrate short, enabling more effective triggering of stacked SCRs. Advantages of implementing isolated P-Wells over a common P-Well in a stacked SCR electrostatic protection device, include faster triggering, lower current triggering, and a reduction in the number of triggering structures required. These advantages are desirable for deep sub-micron ESD protection structures.

25 Claims, 10 Drawing Sheets

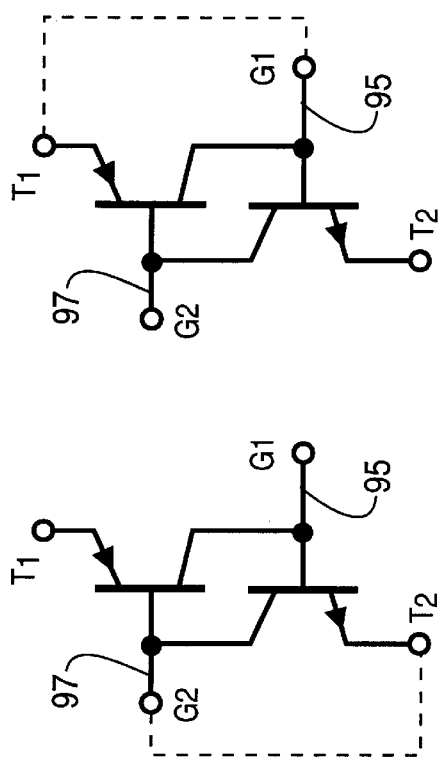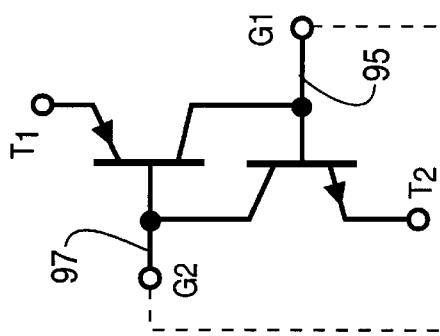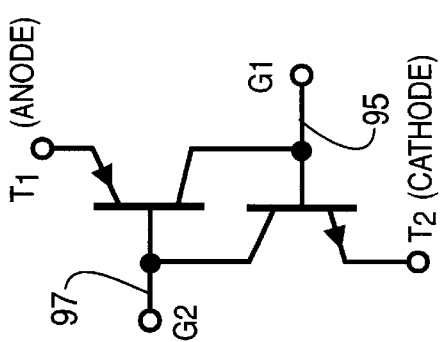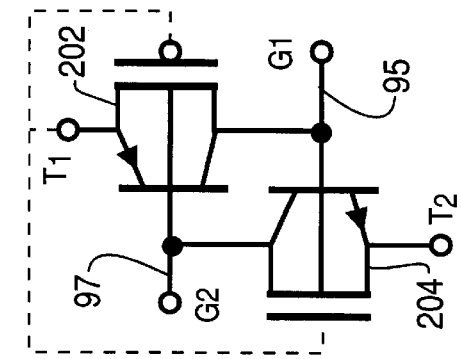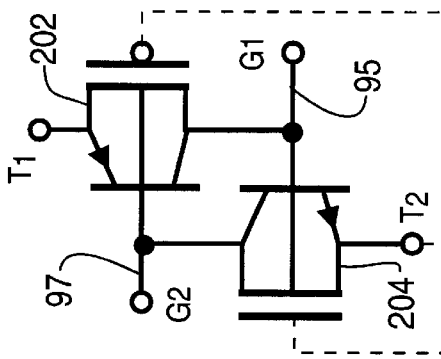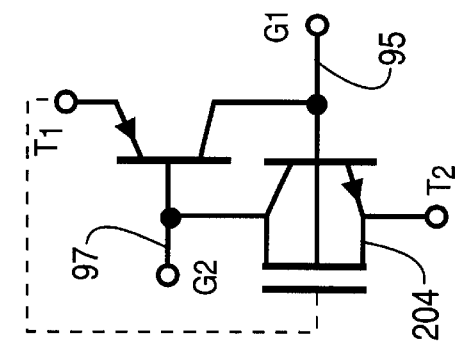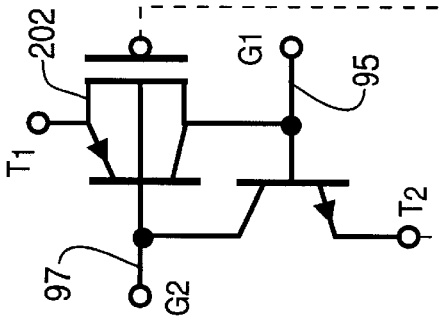
FIG. 5A FIG. 5B FIG. 5C FIG. 5D FIG. 5E FIG. 5F FIG. 5G FIG. 5H

600

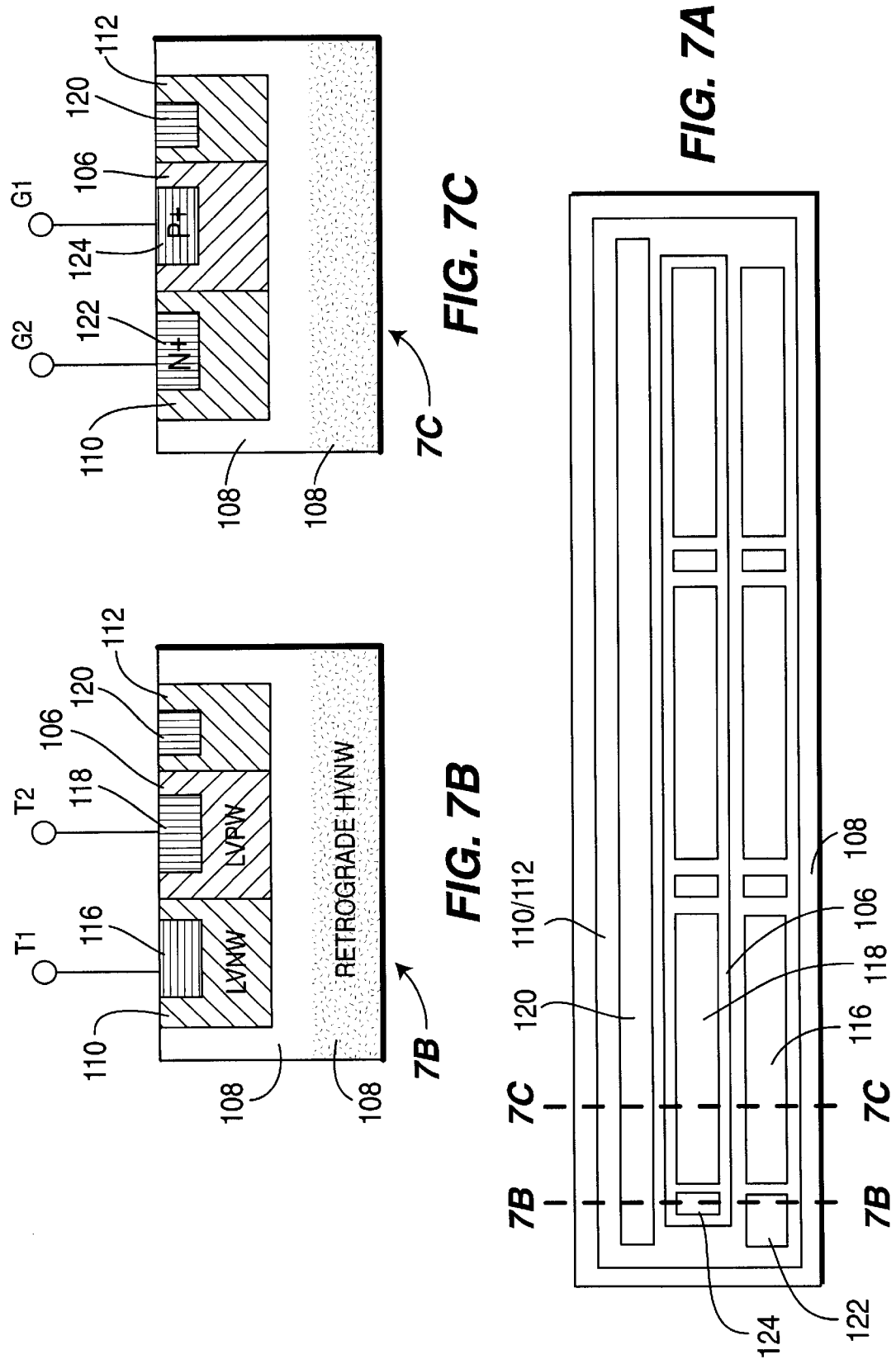

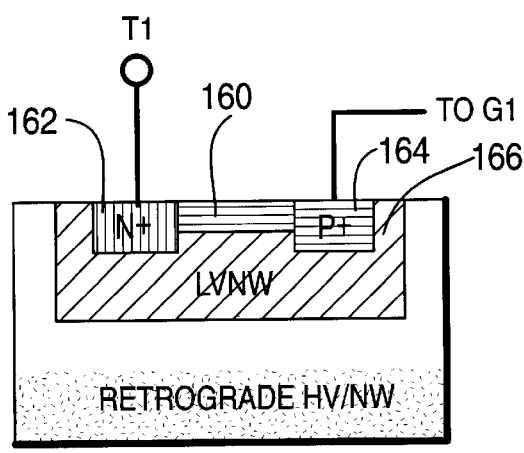
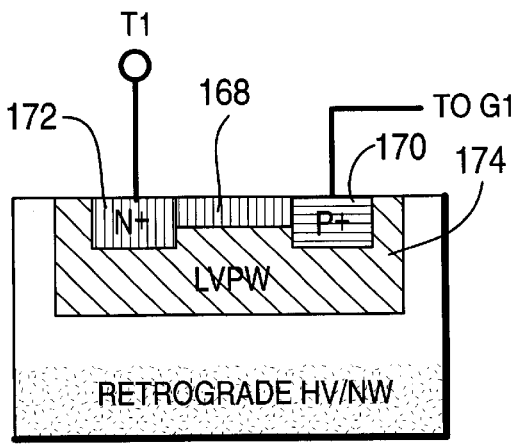
FIG. 10A   FIG. 10B
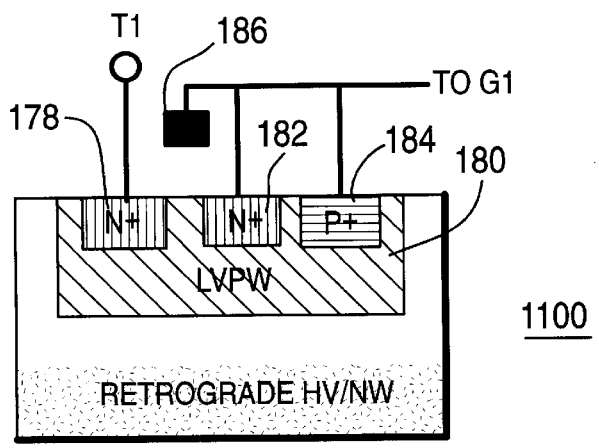
FIG. 11
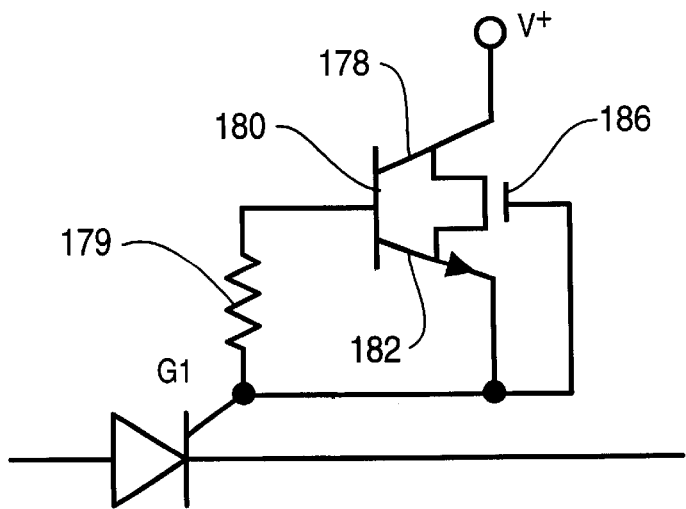
FIG. 12

STACKED SILICON CONTROLLED RECTIFIERS FOR ESD PROTECTION

RELATED APPLICATION

This application is a Continuation-In-Part claiming benefit of U.S. application Ser. No. 09/572,172, filed May 17, 2000.

FIELD OF THE INVENTION

This invention is directed to electronic circuits, and more particularly to electrostatic device protection circuits using stacked silicon controlled rectifiers.

BACKGROUND OF THE INVENTION

Integrated circuits, particularly integrated circuits formed of MOS transistors, are vulnerable to damage from electrostatic discharge (ESD), such as high voltage transients in electrical equipment. In some equipment, high voltage transients may have positive and/or negative peak levels of 100 volts or more and may have a duration of several microseconds. High voltage electrostatic discharge (ESD) transients can also result from a user becoming electrostatically charged, for example, by friction or by induction and touching equipment controls. These transients may have peak voltages of several thousand volts.

As integrated circuits have increased in size to include a larger number of circuit elements, the geometry of the circuit elements has decreased in order to minimize the overall size of the IC. With decreasing geometries of the circuit elements, providing adequate levels of ESD protection has become increasingly more difficult. In MOS circuits the gate oxide thickness has decreased to below 10 nanometers (nm), and breakdown voltages are often less than 10 volts (V). Fowler Nordheim (FN) tunneling through the oxide can occur at voltages as low as 7 V. Device junction breakdown voltages, which are often used to protect the sensitive gate oxide directly, or to trigger a protection structure such as a snap-back device, have remained high to minimize hot carrier generation. In many cases, the minimum junction breakdown voltage is above the gate oxide breakdown voltage.

Many attempts have been made to protect semiconductor devices, such as bipolar transistors, field effect devices, and integrated circuits, from damage due to voltage and current transients. Such protection devices have commonly taken the form of diode or transistor circuits incorporated on the integrated circuit chip for internal transient protection. Protection circuits advantageously utilizing silicon controlled rectifier (SCR) arrangements are also known, for example, see Avery, U.S. Pat. No. 5,615,074; Avery, U.S. Pat. No. 5,343,053; Yu, U.S. Pat. No. 5,986,307; and Avery, U.S. Pat. No. 5,072,273.

One such arrangement, as shown in FIG. 1, involves stacked SCRs, see Avery, U.S. Pat. No. 5,615,074. A stacked SCR arrangement can be placed in parallel with a circuit to provide ESD protection of that circuit. In this arrangement multiple SCRs are connected in series, coupled to a triggering mechanism. The triggering mechanism causes the series of SCRs to conduct upon being triggered by a transient voltage. This voltage, also referred to as the ESD potential, is the voltage that can damage the circuit being protected. The number of SCRs in the series determines, in part, the electrical potential across the series (clamping voltage) during conduction. Stacked SCRs are used to accommodate higher trigger and clamping voltages. Stacked configurations can provide protection from higher voltages and prevent the ESD protection circuit from triggering and clamping at too low a voltage. This is desirable to prevent an ESD protection circuit from conducting unnecessarily due to spurious low voltage transients. FIG. 1 is a circuit diagram of an exemplary configuration of stacked SCRs used to provide ESD protection. Voltages V+ and V− in FIG. 1 represent positive and negative supply voltages, respectively, to circuit 100. Circuit 100 is a circuit to be protected. Circuit 100 is placed in parallel with the stacked SCRs configuration. In FIG. 1, three SCRs 20, 10, and 12, are connected in series between the supply voltages V+ and V−. A triggering mechanism, comprising zener diode 2 and resistor 4 is connected in parallel across the series SCRs. The anode 24 of SCR 20 is connected to the positive supply voltage, V+, and the cathode 3 of SCR 20 is connected to the anode 9 of SCR 10. The cathode 5 of SCR 10 is connected to the anode 11 of SCR 12. The cathode 7 of SCR 12 is connected to the supply voltage, V−. G2 gate 6 and G2 gate 8 are connected to the negative supply voltage, V−, so as to turn SCRs 10 and 12 on. G1 gates 14, 16, and 18 are connected to ground. SCR 20 has its G2 gate 22 connected to the positive power supply, V+, through resistor 4 to keep SCR 20 in an off state. A zener diode 2 is connected between the negative supply voltage, V−, and G2 gate 22 of SCR 20. In normal operation of circuit 100, SCR 20 is turned off and only a small leakage current flows through the zener diode 2. Also, SCRs 10 and 12 are turned on. When a transient voltage is applied to the supply voltage, the zener diode 2 holds gate 22 at the voltage of the zener diode 2. The current flowing through zener diode 2 also flows through resistor 4. This current causes a voltage drop across resistor 4. The voltage across resistor 4 is also the voltage across G2 gate 22 and anode 24 of SCR 20. Once the voltage drop across resistor 4 becomes greater than Vbe, SCR 20 turns on. Vbe is the voltage that causes conduction across a p/n junction within SCR 20 (e.g., 0.7 volts). When SCR 20 turns on, the transient voltage is clamped, providing ESD protection.

Typically, in this stacked configuration, the G1 gates of each SCR are formed within a common well, such as a P-Well, within the substrate of an integrated circuit. One disadvantage of a stacked configuration using a common well region is that, because the G1 gates are tied together, the turn on times are slow. In some cases, the current used to rapidly trigger the SCRs into the on state implies the use of a large area trigger device. Thus, a significant advantage to the art would be provided by a stacked configuration of SCRs not requiring the gates of multiple SCRs to be electrically coupled to a common well, as this essentially forces the gates of the upper SCRs, 20 and 10, to be reversed biased with respect to their respective cathodes.

SUMMARY OF THE INVENTION

The present invention comprises an electrostatic protection circuit formed from a plurality of silicon controlled rectifiers connected in series. Each silicon controlled rectifier has a first gate, a second gate, a cathode, and an anode. The anode of the first silicon controlled rectifier is electrically coupled to the first end of the series connection and the cathode of the last silicon controlled rectifier is electrically coupled to the second end of the series connection. The first and second gates of each silicon controlled rectifier, except the last silicon controlled rectifier, are cross coupled. The circuit is activated by a triggering mechanism that is electrically coupled to one of the gates of the last silicon controlled rectifier.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 5A is a schematic representation of a single SCR;

FIG. 5B is a schematic representation of a single SCR with coupled gates;

FIG. 5C is a schematic representation of a single SCR depicting the coupling of the G2 gate and the cathode;

FIG. 5D is a schematic representation of a single SCR depicting the coupling of the G1 gate and the anode;

FIG. 5E is a schematic representation of a single SCR depicting the coupling of a MOS gate and the cathode;

FIG. 5F is a schematic representation of a single SCR depicting the coupling of a MOS gate and the anode;

FIG. 5G is a schematic representation of a single SCR depicting the coupling of a common MOS gate and the cathode;

FIG. 5H is a schematic representation of a single SCR depicting the coupling of a common MOS gate and the anode;

FIG. 7A is a plan view of an exemplary embodiment of a single SCR structure, in accordance with the subject invention;

FIG. 7B is a cross section diagram of the single SCR structure shown in FIG. 7A which shows an exemplary embodiment of a single SCR structure implemented in an isolated P-Well;

FIG. 7C is a cross section diagram of the stacked SCR structure shown in FIG. 7A through the gate contact region;

FIG. 10A is a cross section diagram of a low voltage breakdown diode formed using a lightly doped p-type diffusion;

FIG. 10B is a cross section diagram of a low voltage breakdown diode formed using a lightly doped n-type diffusion;

FIG. 11 is an illustration of a cross section diagram of an NMOS device incorporating a parasitic lateral npn transistor which may be used as a trigger device;

FIG. 12 is an equivalent circuit schematic illustrating an embodiment of a parasitic lateral npn transistor structure depicted in FIG. 11;

DETAILED DESCRIPTION

An exemplary embodiment of the invention eliminates the common P-Well in a stacked SCR structure by providing isolated P-Wells. An embodiment of the invention makes use of a high voltage CMOS process incorporating a relatively heavily doped buried N layer that enables the formation of junction isolated P-Wells surrounded by an N-Well. The complete isolation of the P-Well possible in this process prevents the normal P-Well to P substrate short, enabling more effective triggering of stacked SCRs. Advantages of implementing isolated P-Wells over using a common P-Well include faster triggering, lower current triggering, and a reduction in the number of triggering structures and the silicon area required. These advantages are desirable for deep sub-micron ESD protection structures.

Figure 1:
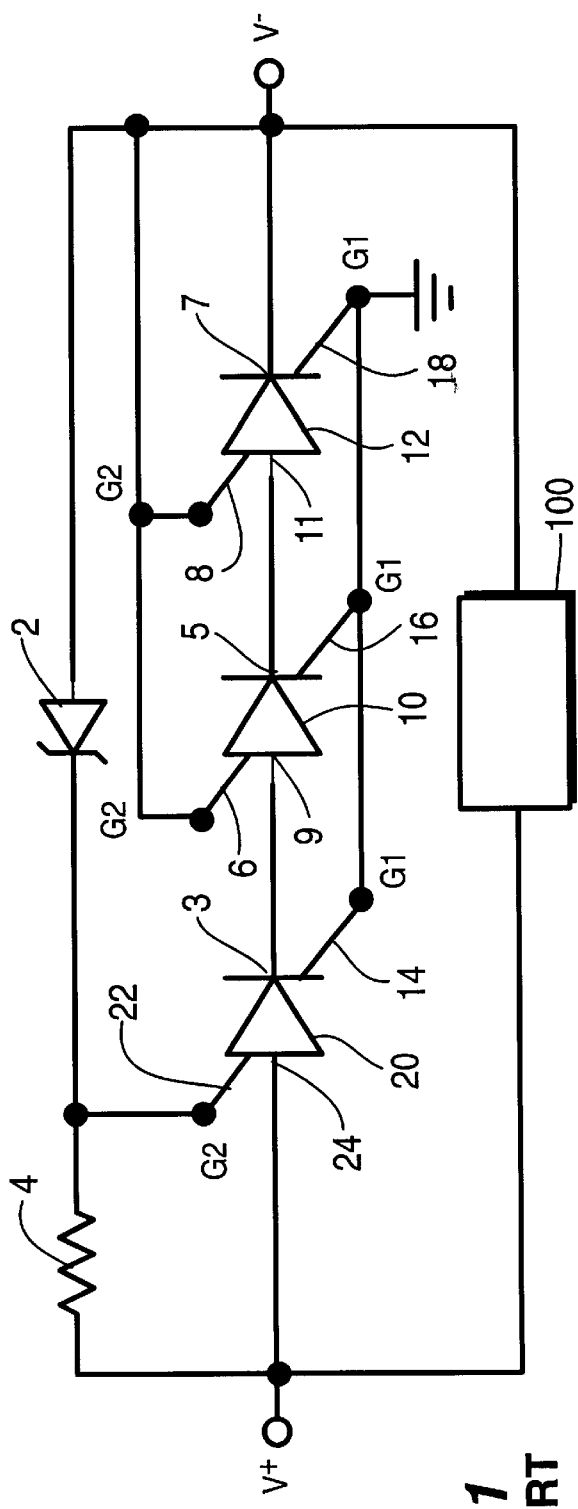
FIG. 1 (prior art) is a circuit diagram of an exemplary configuration of stacked SCRs used to provide ESD protection.
Figure 2:
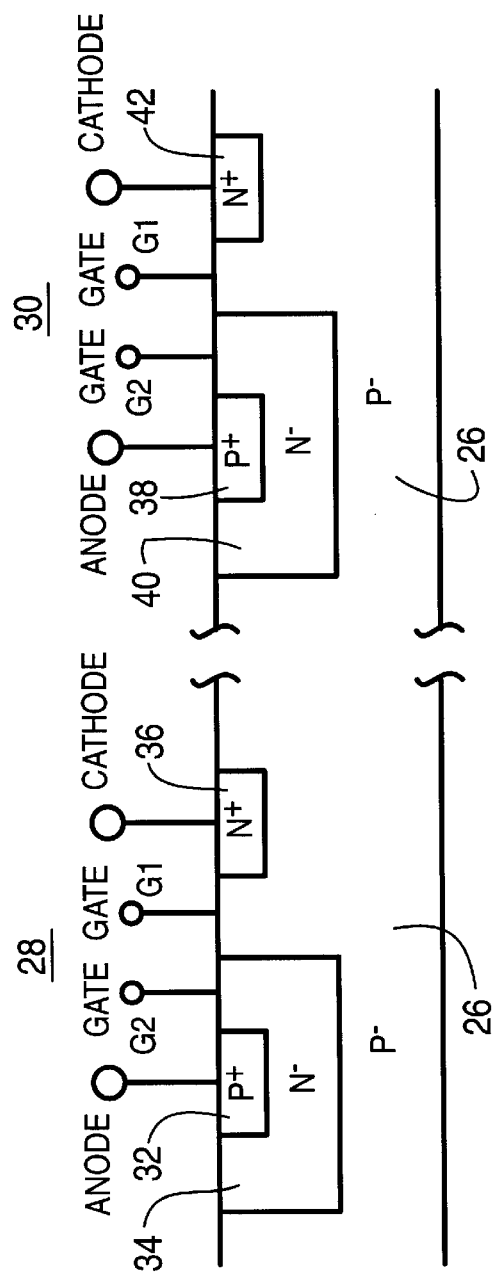
FIG. 2 (prior art) is an illustration of multiple cross sections of an exemplary embodiment of SCRs implemented in a common P-Substrate.

FIG. 2 is an illustration of multiple cross sections of an exemplary embodiment of SCRs implemented in a common P-Well. Cross sections of two representative SCRs 28, 30 are shown in FIG. 2. Common P-Well 26 is composed of P-type semiconductor material such as silicon doped with boron. P-type semiconductor is typically relatively lightly doped (e.g., $10^{13}$/cc) and has a relatively low conductivity. Gate region 34 is formed in region 26. Gate, G2, region 34 is formed of N-type semiconductor material such as silicon doped with phosphorous. N-type semiconductor is relatively lightly doped (e.g., $10^{14}$/cc) and has a relatively low degree of conductivity. Anode region 32 is formed in region 34. Region 32 is formed of P+ type conductivity semiconductor material. P+ type semiconductor is relatively heavily doped (e.g., $10^{18}$/cc) and has a relatively high conductivity. Cathode region 36 is formed in region 26. Cathode region 36 is formed of N+ type conductivity semiconductor material. N+ type semiconductor is relatively highly doped (e.g., $10^{18}$/cc) and has a relatively high degree of conductivity. The anode electrode of SCR 28 is electrically coupled to the anode region 32. The gate, G2, electrode of SCR 28 is electrically coupled to gate region 34. The other gate, G1, of SCR 28 is formed by the common P-Well 26. The cathode electrode of SCR 28 is electrically coupled to cathode region 36. Thus, the pnpn junctions of SCR 28 are formed by regions 32, 34, 26, and 36. SCR 30 is formed in the same way as SCR 28. The anode electrode of SCR 30 is electrically coupled to anode region 38. The gate, G2, electrode of SCR 30 is electrically coupled to gate region 40. The other gate, G1, of SCR 30 is formed by common P-Well 26. The cathode electrode of SCR 30 is electrically coupled to cathode region 42. Thus, the pnpn junctions of SCR 30 are formed by regions 38, 40, 26, and 42.

In a stacked configuration implementing a common P-Well, as illustrated in FIG. 2, all SCRs have one of their gates connected to common P-Well 26. The common P-Well, the relatively low conductivity of the P- region 26, and the parallel coupling of the gates requires that the local potential of the common P-well be raised to ensure triggering of each of the SCRs. This requires significant current flow (typically on the order of tens of milliamperes) which raises the potential on the whole stack and delays triggering and clamping.

Figure 3:
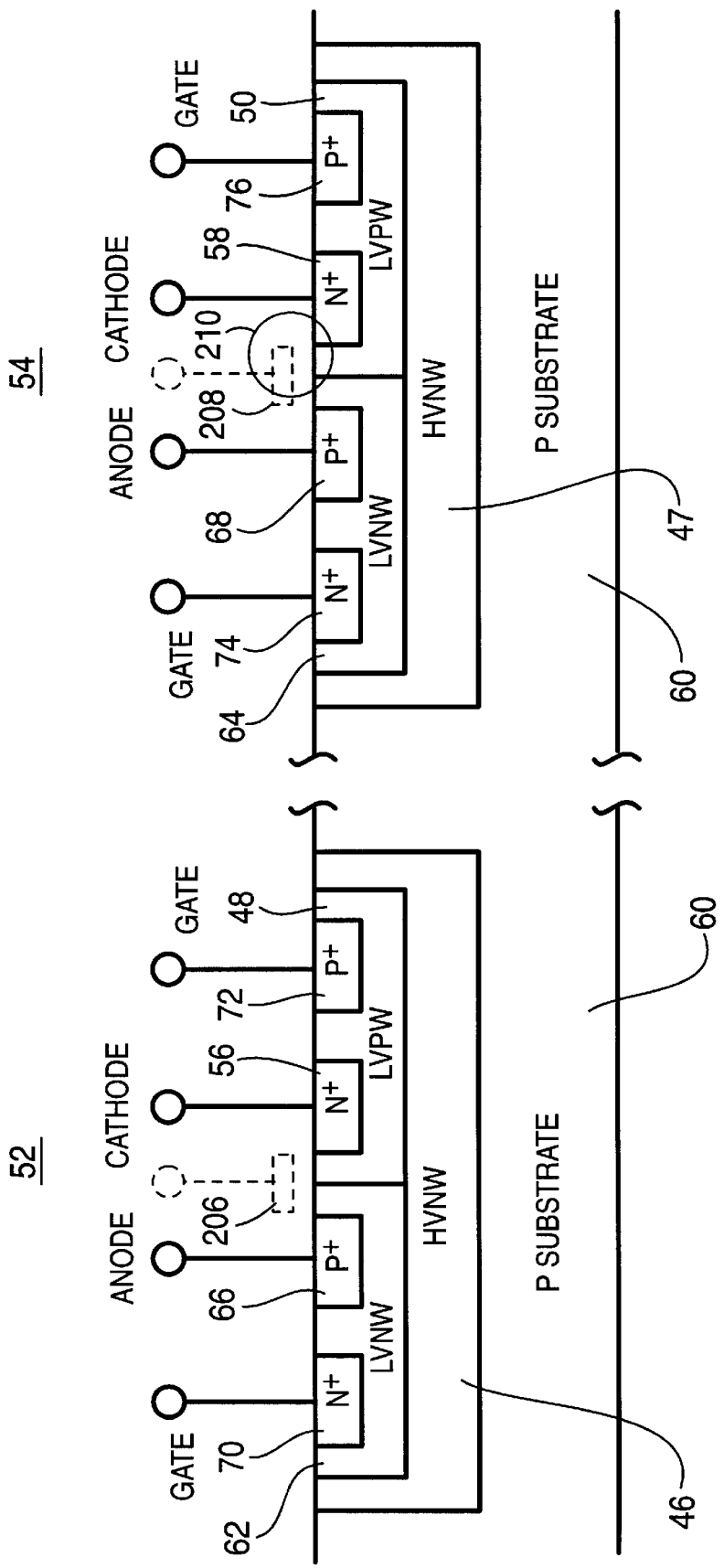
FIG. 3 is an illustration of multiple cross sections of two SCRs formed according to an exemplary embodiment of the invention.

FIG. 3 is an illustration of multiple cross sections of two SCRs 52, 54 formed according to an exemplary embodiment of the invention. In FIG. 3, multiple cross sections are superimposed on one figure to facilitate this description. Retrograde N-well 46 incorporates a relatively heavily doped buried N layer, formed in substrate 60 by a high voltage implantation process, and a lighter doped region extending to the surface. Retrograde high voltage N-Well 46 forms an isolation region for low voltage P-Well 48. In the retrograde N-Well 46,. the surface n-type concentration is lower than the deeper n-type concentration. This enables additional doping and counter doping to form more heavily doped N-Well 62 and P-Well 48 completely surrounded by, and contained within, the high voltage retrograde N-Well 46. N+ region 56 is formed in low voltage P-Well 48 to form the cathode of SCR 52. N+ region 56 is formed by an implantation and diffusion process. Low voltage N-Well 62 is introduced in retrograde high voltage N-Well 46, alongside low voltage P-Well 48.

P+ region 66 is formed in low voltage N-Well 62 to form the anode of SCR 52. P+ region 66 is formed by an implantation and diffusion process. N+ region 70 and low voltage N-Well region 62 form one of the gates of SCR 52. Region 70 is formed in the low voltage N-Well 62 by an implantation and diffusion process. P+ region 72 and low voltage P-Well region 48 form the other gate of SCR 52. Region 72 is formed in the low voltage P-Well 48 by an implantation and diffusion process. Thus, the pnpn junctions of SCR 52 are formed by regions 66, 62, 48, and 56, with electrical contact to gate regions 62 and 48 being made by regions 70 and 72 respectively.

Optional common poly gates 206 and 208 form a P-type Metal Oxide Semiconductor (PMOS) transistor and an N-type Metal Oxide Semiconductor (NMOS) transistor for each SCR 52 and 54. The PMOS transistor for SCR 52 is formed between the P+ region 66 and the low voltage P-well region 48. The NMOS transistor for SCR 52 is formed between the N+ region 56 and the low voltage N-well region 62. The PMOS and NMOS transistors for SCR 54 are formed in a similar manner. That is, the PMOS transistor for SCR 54 is formed between the P+ region 68 and the low voltage P-well region 50. The NMOS transistor for SCR 54 is formed between the N+ region 58 and the low voltage N-well region 64.

In an alternate exemplary embodiment of the invention, only the portion of poly gate 208 contained in circle 210 forms an MOS transistor. Therefore, only an NMOS transistor is formed for SCR 54. This NMOS transistor is formed between the N+ region 58 and the low voltage N-well region 64. In yet another exemplary embodiment of the invention, only a PMOS transistor is formed for SCR 54 between the P+ region 68 and the low voltage P-well region 50. The aforementioned variations of poly gate 208 for SCR 54 also apply to poly gate 206 for SCR 52. Also, alternate exemplary embodiments of the invention include all combinations of these variations.

Optional common poly gates may be used in various embodiments of the invention to bias an SCR into forward conduction ("on" state), as described further below with reference to FIGS. 5A through 5H.

SCR 54 is formed in the same way as SCR 52. A separate retrograde high voltage N-Well, 47, is introduced by implantation and diffusion in P-Substrate, 60. The gate regions 64 and 50 are formed in a similar manner to gate regions 62 and 48 respectively. The anode region 68, and cathode regions 58 are formed in a similar manner to anode region 66 and cathode region 56 respectively. Thus the pnp junctions of SCR 54 are formed by regions 68, 64, 50, and 58, with electrical contact to gate regions 64 and 50 being made by regions 74 and 76 respectively.

In another embodiment of the invention, the gates of the SCRs are formed by the low voltage N-Wells and low voltage P-Wells without the introduction of the N+ and P+ contact regions. For example, in FIG. 3 the gate of SCR 52 that is formed by N+ contact region 70 in low voltage N-Well 62 is alternatively formed by low voltage N-Well 62 alone, without N+ region 70. The gate of SCR 52 that is formed by P+ contact region 72 in P-Well 48 is alternatively formed by low voltage P-Well 48 alone, without P+ region 72. This alternative configuration can be implemented for each SCR in the structure. Other embodiments of the invention allow all combinations of gate coupling configurations. It is also contemplated that the high voltage retrograde well region may be a high voltage retrograde P-Well built on an N-type substrate.

Figure 4:
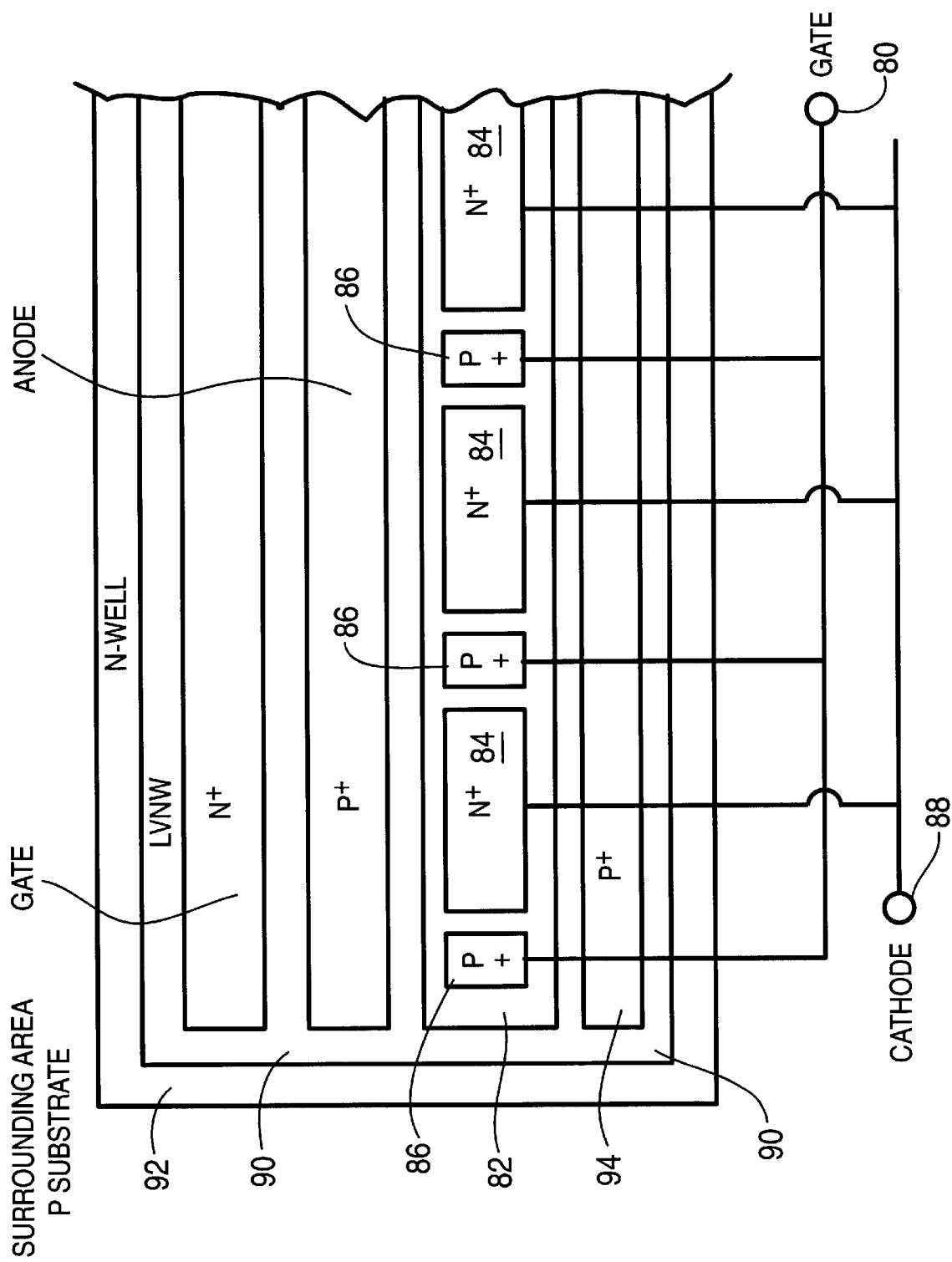
FIG. 4 is an illustration of a portion of a plan view of an SCR according to another exemplary embodiment of the invention.

FIG. 4 shows a section of a plan view of another exemplary embodiment of the invention. In this embodiment of the invention, one of the gate electrodes and the cathode electrode of an SCR are electrically coupled to interdigitated P+ and N+ regions 86 and 84. Gate electrode 80 is electrically coupled to P+ regions 86. Cathode electrode 88 is electrically coupled to N+ regions 84. P+ regions 86 and N+ regions 84 are formed by implantation and diffusion in low voltage P-Well 82. The interdigitation of the P+ and N+ regions is a feature of one embodiments of a triggering mechanism. The interdigitated P+ and N+ regions may be configured to provide the resistance component of a triggering mechanism, as described below.

In yet another exemplary embodiment of the invention, as illustrated in FIG. 4, low voltage N-Well region 90 is formed in retrograde N-Well 92. N-Well 90 is utilized to prevent inversion on the surface of N-Well 92. Also, N-Well 90 can be used to provide capacitive coupling to enhance circuit activation. In another exemplary embodiment of the invention, as illustrated in FIG. 4, P+ region 94 is formed in low voltage N-Well 90. An advantage of forming P+ region 94 in region 90 includes providing an additional anode. Alternatively, region 94 may be N+ type, forming an additional gate contact to the N-Well 92. An advantage of forming the additional gate electrode is described below with reference to FIGS. 9A and 9B.

FIG. 5A is a schematic representation of a single SCR. The main terminals are the anode, T1, the cathode, T2, and the gate terminals G1 95 and G2 97. In normal operation, T1 is connected to a relatively positive potential and T2 is connected to a relatively negative potential. When the gate terminals 95 and 97 are unconnected, the SCR is in the off state. However, the SCR can be triggered into the on state by fast transients occurring at the anode, which are capacitively coupled to the G1 gate through the p/n junction, G2 to G1, and the forward diode between T1 and G2. When the G1 95 and G2 97 terminals are connected together, as shown in FIG. 5B, the SCR turns on as soon as the potential between the T1 and T2 terminals exceeds 2Vbe (e.g., when the difference between T1 and T2 is approximately 1.5 volts). When G1 95 is connected to terminal T2 and G2 97 is connected to terminal T1, the SCR is effectively turned off until the voltage applied between T1 and T2 exceeds the breakdown voltage of the SCR. In normal operation, a single SCR has its T1 terminal connected to a source of positive potential and its T2 terminal connected to a source of negative potential. The SCR is turned on from the off state by a trigger mechanism connected either to the G1 95 or G2 97 terminal. The trigger mechanism as described below, connected to the G1 95 terminal, may involve some form of voltage breakdown structure such as a zener diode or an npn transistor driven into the snap-back (Vce$_{sus}$) mode. As described below with reference to FIGS. 11, 12, 13, and 14, the npn transistor may be formed parasitically with a grounded gate NMOS (ggNMOS) transistor.

FIGS. 5B through 5H are schematic representations of various configurations of SCRs biased to be in the "on" state when the SCR is exposed to voltage potentials that are less than typical ESD voltages. In FIG. 5B, gate G1 95 is coupled to gate G2 97, as indicated by the dashed line. The SCR of FIG. 5B is in the "on" state when the voltage across the SCR is approximately 1.5 volts. The coupling between gate G1 95 and gate G2 97 may exhibit practically no resistance (e.g., metallic connection), or exhibit resistance values of less than a few kilo-ohms. The dashed line in FIG. 5C shows the cathode T2 coupled to gate G2 97. FIG. 5D shows the gate G1 95 coupled to the anode T1. The SCR in each of the two configurations depicted in FIGS. 5C and 5D is tuned on when the potential across the anode and cathode exceeds one Vbe.

FIG. 5E is a schematic diagram showing an SCR with PMOS 202 connected across the pnp transistor. In FIG. 5E, the source of PMOS 202 is coupled to the anode T1, and the drain of PMOS 202 is coupled to the gate G1 95. The circuit in FIG. 5E is configured in the "on" state by the coupling of the gate electrode of PMOS 202 to the cathode T2, as indicated by the dashed line. FIG. 5F shows an N-type Metal Oxide Semiconductor (NMOS) connected across the npn transistor. In FIG. 5F, the source of NMOS 204 is coupled to the cathode T2 and the drain of NMOS 204 is coupled to gate G2 97. The circuit in FIG. 5F is configured in the "on" state by the coupling of the gate electrode of NMOS 204 to the anode T1. In these two configurations, the SCR is turned on when the potential across the anode and the cathode exceeds the turn on threshold voltage V$_{gs}$ of the MOS transistor.

FIG. 5G is a schematic diagram depicting an SCR with an NMOS and a PMOS connected to the transistors. In FIG. 5G, the SCR is constructed such that both NMOS 204 and PMOS 202 are formed simultaneously with a common Metal Oxide Semiconductor (MOS) gate. The structure of this gate is described above with reference to FIG. 3. The source of PMOS 202 is coupled to the anode T1, and the drain of PMOS 202 is coupled to the gate G1 95. The source of NMOS 204 is coupled to the cathode T2 and the drain of NMOS 204 is coupled to gate G2 97. In the embodiment depicted in FIG. 5G, PMOS 202 is configured to be in the "on" state, and NMOS 204 is configured to be in the "off" state. This configuration is shown by the dashed lines coupling the common MOS gate with cathode T2. In this configuration, the SCR is turned on when the voltage potential across the anode and the cathode is greater than the threshold voltage of the NMOS transistor 204.

The structure of the SCR in FIG. 5H is the same as the structure of the SCR in FIG. 5G. That is, the SCR is constructed such that both NMOS 204 and PMOS 202 are formed simultaneously with a common Metal Oxide Semiconductor (MOS) gate. The source of PMOS 202 is coupled to the anode T1, and the drain of PMOS 202 is coupled to the gate G1 95. The source of NMOS 204 is coupled to the cathode T2 and the drain of NMOS 204 is coupled to gate G2 95. In the embodiment depicted in FIG. 5H, NMOS 204 is configured to be in the "on" state, and PMOS 202 is configured to be in the "off" state. This configuration is shown by the dashed lines coupling the common MOS gate with the anode T1. In this configuration, the SCR is turned on when the voltage potential across the anode and the cathode is greater than the threshold voltage of the PMOS transistor 202.

Although, FIGS. 5B through 5H each depict a single configuration for putting an SCR in the "on" state, it is understood that the individual configurations may be combined. For example, an SCR may be configured to be in the "on" state by combining the mechanism depicted in both FIGS. 5C and 5F.

Figure 6:
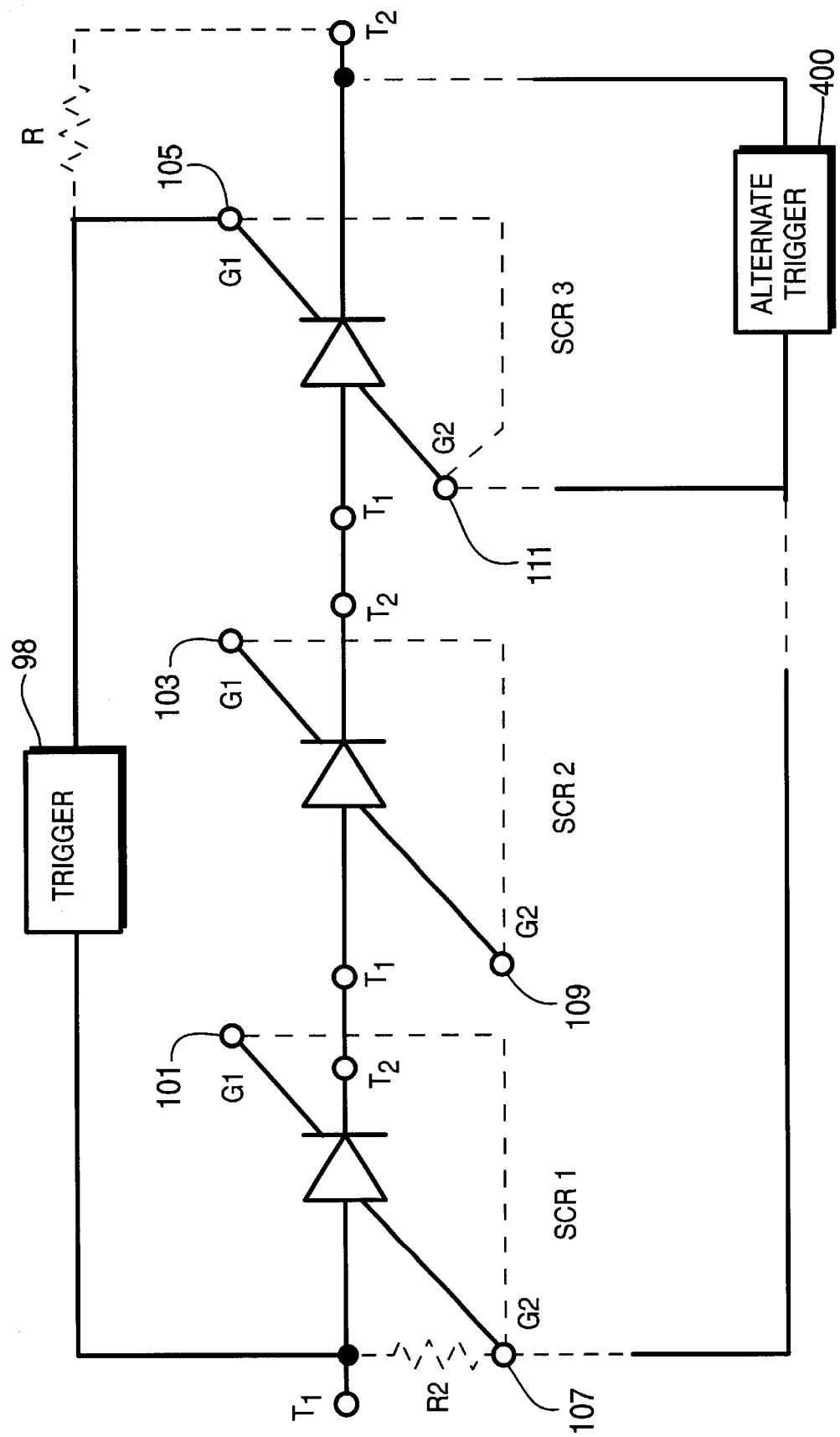
FIG. 6 is a schematic diagram illustrating multiple exemplary embodiments of the invention implemented using a stacked SCR structure with isolated P-Wells.

FIG. 6 is a schematic diagrams illustrating exemplary embodiments of the invention implementing a stacked SCR structure having isolated P-Wells. The first embodiment shown in FIG. 6 depicts a stacked structure comprising three SCRs and a separate trigger mechanism 98. The isolated P-Well configuration of the proposed SCR structure prevents the G1 terminals 101, 103 and 105, of SCR1, SCR2 and SCR3, respectively, from being shorted to the p-type substrate. As indicated by the dashed lines between the gates in FIG. 6A, the G1 and G2 gates of SCR1 and SCR2 may be electrically coupled together or may be unconnected (floating). Electrically coupling gate terminals G1 101 to G2 107 and G1 103 to G2 109 puts SCR1 and SCR2 in condition to transition to the on state when the voltage between the T1 and T2 terminal for each SCR is greater than 2Vbe for each SCR. In a first embodiment, G2 111 of SCR3 is unconnected (floating), and G1 105 of SCR3 is electrically coupled to the triggering mechanism 98. An advantage of this configuration is that the trigger voltage is set, primarily, by the breakdown voltage of the trigger mechanism. Another advantage is that the holding voltage of the SCR stacked structure is determined by the number of SCRs in the stacked structure. Floating the gates, that is having gate G1 101, gate G2 107, gate G1 103, and gate G2 109 unconnected, puts SCR1 and SCR2 in condition to transition to the on state when a transient voltage present on the T1 terminal for each SCR induces a voltage, through capacitive coupling, on the gate of each SCR with respect to it T2 terminal (i.e., G1-T2 is greater than Vbe).

An alternative triggering means, trigger 400, may be connected between G2 111 and T2 of SCR3, as shown in FIG. 6. In this arrangement the G1 and G2 gates of SCR1 and SCR2 are electrically coupled as shown. The triggering voltage is determined by the trigger mechanism, plus five Vbe. Five Vbe being approximately 3.5 volts. If desired, a resistor (not shown) may be added between the T1 and G2 111 terminal of SCR3 to prevent triggering by fast transients.

Another embodiment of the invention implements alternative triggering means 400 and resistance R$_2$. In this embodiment, the G1 and G2 gates of SCR2 and SCR3 are electrically coupled as shown by the dashed lines in FIG. 6, and gate G1 101 of SCR1 is not connected (floating). Resistance R$_2$ is electrically coupled to terminal T1 and gate G2 of SCR1.

Multiple embodiments of the invention are possible by varying the number of SCRs in the stacked structure, and varying the breakdown voltage of the trigger structure; thus providing a wide range of ESD protection arrangements. One embodiment of a triggering mechanism comprises a diode and a resistance. In this embodiment of a triggering mechanism, trigger 98 represents an avalanche breakdown diode, and the dashed line resistance, R, represents a resistance to shunt low level noise current from the trigger diode, to prevent false triggering. Another embodiment of a triggering mechanism, which is described in more detail below with reference to FIGS. 11, 12, 13, and 14, comprises a lateral parasitic npn transistor.

Figure 8A:
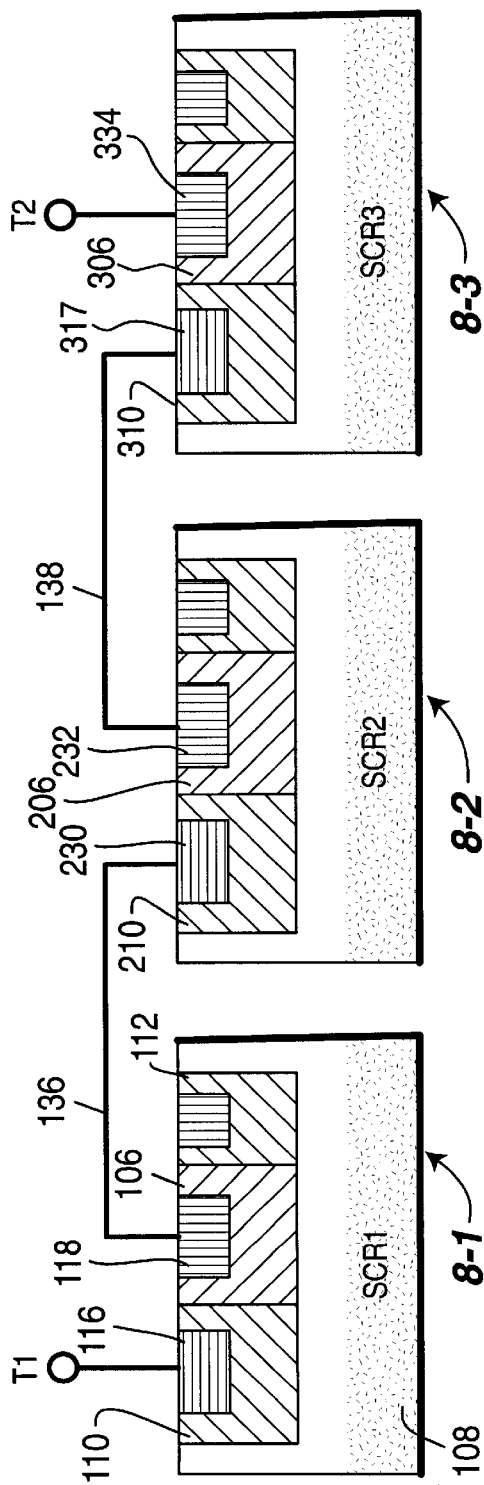
FIG. 8A shows multiple cross section diagrams of an exemplary embodiment of a stacked SCR structure showing connections to the main terminals and between the individual SCRs.
Figure 8B:
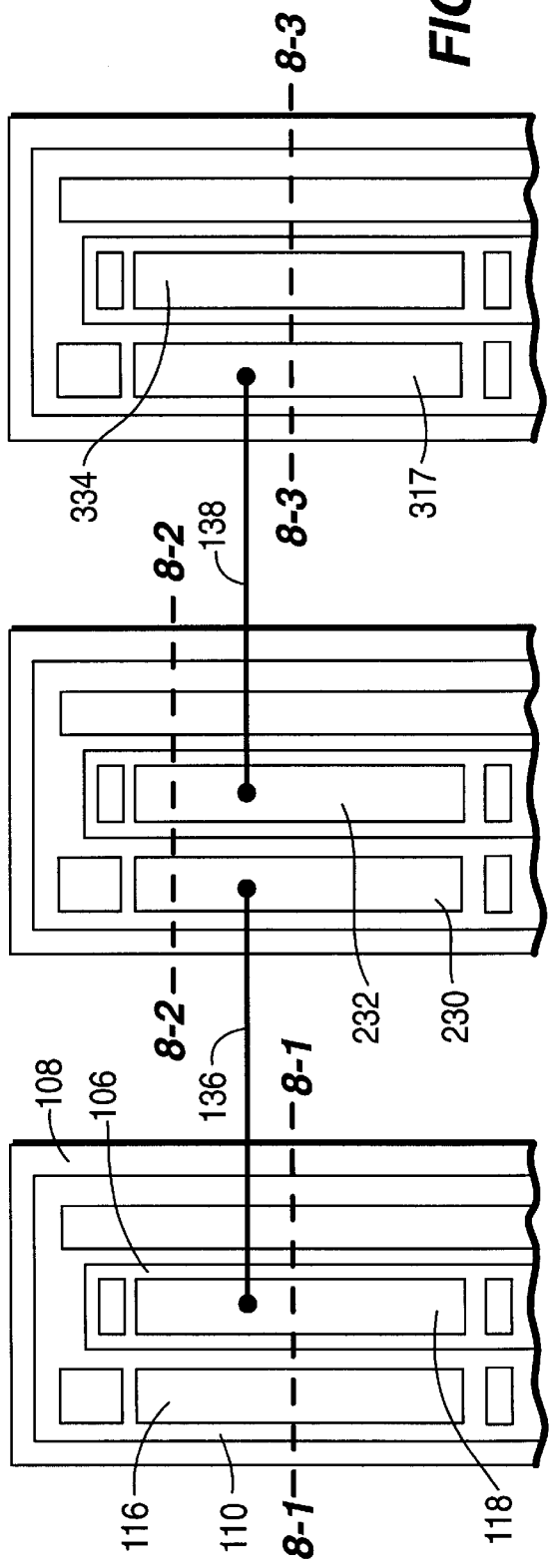
FIG. 8B is the plan view of FIG. 7A showing the structures and connections illustrated in FIG. 8A.
Figures 9A, 9B:
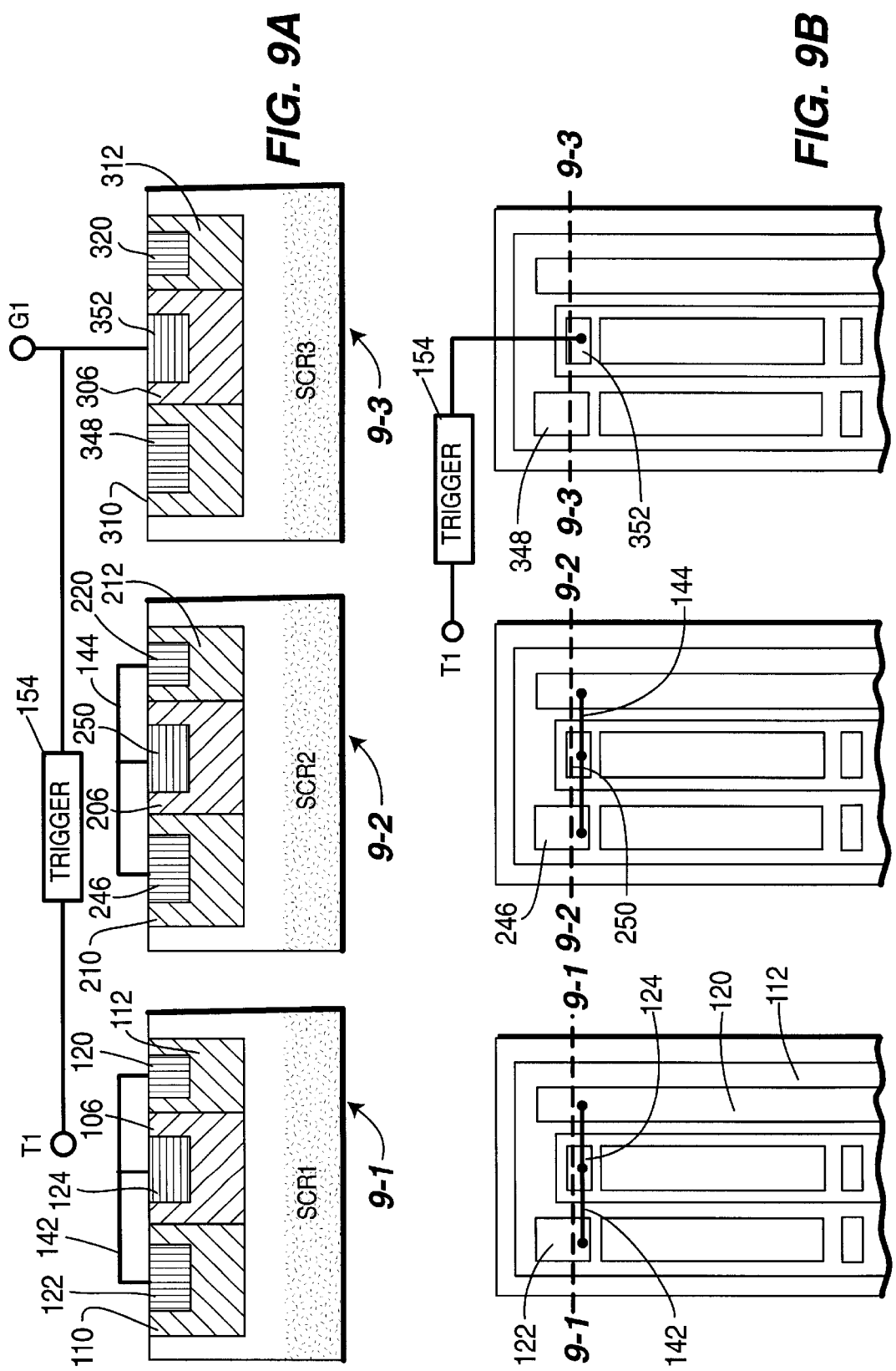
FIG. 9A shows multiple cross section diagrams of an exemplary embodiment of a stacked SCR structure showing connections to the triggering mechanism and between the gate connections.
FIG. 9B is the plan view of FIG. 7A illustrating the connections in FIG. 9A.

FIG. 7A is a plan view of an exemplary embodiment of an SCR structure illustrating the interleaved arrangement of the anode, cathode, and gate regions. Connections are not shown for the sake of clarity. Connections between the anodes and cathodes of multiple SCRs are shown in FIGS. 8A and 8B, and gate connections of multiple SCRs are shown in FIGS. 9A and 9B. FIGS. 7B and 7C are cross sectional views of the structure depicted in FIG. 7A. As depicted in FIG. 7A, the structure comprises gate G2 region 110 with G2 contact region 122, gate G1 region 106 with G1 contact region 124, anode region 116, and cathode region 118.

FIG. 7B is a cross sectional view of the exemplary embodiment of the structure shown in FIG. 7A having an isolated P-Well region 106. The general location of the cross sectional view is depicted by dashed line 7B—7B. FIG. 7C is a cross sectional view of the structure shown in FIG. 7A through at least one of the gate contact regions. The general location of the cross sectional view is depicted by dashed line 7C—7C. In an embodiment of the invention as illustrated in FIGS. 7A, 7B, and 7C, high voltage retrograde N-Well region 108 is formed in a p-type silicon substrate (p-type substrate not shown) using conventional techniques of implantation and diffusion. In the retrograde N-Well 108, the surface n-type concentration is lower than the deeper n-type concentration, enabling additional doping and counter doping to form more heavily doped N-Wells 110 and 112 and P-Well 106 completely surrounded by, and contained within, the high voltage N-Well 108. Additional counter doping by even heavier implant doses allows the formation of the anode region 116 and the cathode region 118. N-Well region 112 and N+ region 120 are used in some processes to prevent surface inversion of the high voltage N-Well 108. In such processes, region 112 may be an extension of the low voltage N-Well 110. Referring to FIG. 5 and FIG. 7A, in an embodiment of the invention, the low voltage N-Well region 110 forms gate G2 97 of a single SCR structure, and the low voltage P-Well region 106 forms gate G1 95 of a single SCR structure.

In FIG. 7C, low voltage N-Wells 110 and 112 are contacted by more heavily doped N+ regions 122 and 120, respectively. Low voltage P-Well 106 is contacted by more heavily doped P+ region 124. Alternative embodiments of the invention may not include at least one of P+ region 124, N+ region 122, and N+ region 120.

FIG. 8A illustrates multiple cross sections of an exemplary embodiment of a stacked SCR structure showing connections to the main terminals and between the individual SCRs. FIG. 8B is a plan view showing the structures and connections illustrated in FIG. 8A. Reference to the schematic diagrams of FIG. 6 may aid in understanding the embodiments depicted in FIGS. 8A and 8B. Dashed lines 8-1—8-1, 8-2—8-2, and 8-3—8-3 indicate the locations of the cross sectional views of SCR1, SCR2, and SCR3, respectively, in FIG. 8A. In FIG. 8A, region 118, which forms cathode terminal T2 of SCR1, is electrically coupled to region 230, which forms anode terminal T1 of SCR2. This coupling is represented by connector 136, which is depicted in FIGS. 8A and 8B. Region 232, which forms cathode region T2 of SCR2, is electrically coupled to region 317, which forms anode region T1 of SCR3. This coupling is represented by connector 138, which is depicted in FIGS. 8A and 8B.

FIG. 9A illustrates multiple cross sections of an exemplary embodiment of a stacked SCR structure showing connections to the triggering mechanism 154 and between the gate connections. FIG. 9B is a plan view illustrating the connections in FIG. 9A. The connections shown in FIGS. 8A and 8B are not shown in FIGS. 9A and 9B for the sake of clarity. Reference to the schematic diagrams of FIG. 6 may aid in understanding the embodiments depicted in FIGS. 9A and 9B. Gate G2 of SCR1, formed by region 110, is electrically coupled to gate G1 of SCR1, formed by region 106, and gate G2 of SCR2, formed by region 210, is electrically coupled to gate G1 of SCR2, formed in region 206. Gate G2 of SCR3, formed by region 310 is unconnected (floating). Gate G1 of SCR3, formed by region 306, is electrically coupled to triggering mechanism 154. Electrical connections to the G2 regions of SCR1, SCR2, and SCR3, are made through the heavily doped N+ regions 122, 246 and 348 respectively, and the contact to the G1 regions of SCR1, SCR2, and SCR3 are made by P+ regions 124, 250, and 352 respectively. N-Well region 112 and N+ region 120 in SCR1 and N-Well region 212 and N+ region 220, 1) enhance the turn on characteristics (e.g., by providing added capacitance for transient, dv/dt, triggering) of the SCR structure, 2) serve as surface channel blocking regions, and 3) may also function as an additional anode by changing N+ regions 120 and 220 to P+ and changing connections accordingly. An alternate embodiment of the SCR structure in FIGS. 9A and 9B omits at least one of the N-Well region 112, 212 and N+ region 120, 220. Dashed lines 9-1—9-1, 9-2—9-2, and 9-3—9-3 indicate the locations of the cross sectional views of SCR1, SCR2, and SCR3, respectively, in FIG. 9A.

Various embodiments of triggering mechanisms are compatible with a stacked SCR structure. One embodiment of a triggering mechanism comprises a resistor and an avalanche diode. The resistance may be in the form of an external resistor or may be internal to the integrated circuit. One embodiment of internal resistance is formed by the P-Well 82 contacted by interdigitated P+ regions 86 depicted in FIG. 4. The resistance is formed in the P-Well 82, between the N+ cathode regions 84 facing the P+ anode region, and the P+ gate contact regions 86. An alternative embodiment would eliminate the retrograde N-Well so the P-Well and N-Wells are formed in the P-Substrate. If the P-Substrate is P+ type, the resistance would be formed vertically. At least one embodiment of a triggering mechanism utilizes a zener diode. This diode may be external or it may be formed in the integrated circuit. FIG. 10A shows a cross section of a low voltage breakdown diode (e.g., zener diode). This diode is formed by using the lightly doped p-type drain (PLDD) extension, that is typically used in MOS design, to enhance the voltage capability of PMOS transistors. The zener breakdown occurs at the junction between PLDD region 160 and N+ region 162. P+ region 164 is used to make contact to the PLDD region 160. Although the zener diode illustrated in FIG. 10A is shown formed in an N-Well 166, it may also be formed in a P-Well. The latter generally results in a slightly lower breakdown voltage than the counter doping of PLDD region in the low voltage N-Well, due to the enhancing nature of the two p-type diffusions.

FIG. 10B is a cross sectional view of a low voltage breakdown diode formed by a lightly doped n-type diffusion (NLDD), such as the lightly doped diffusion n-type drain extensions used to form NMOS transistors. The zener breakdown occurs at the junction of NLDD region 168 and P+ region 170. N+ region 172 serves to make good contact with NLDD region 168. Although the zener diode illustrated in FIG. 10B is shown formed in a P-Well 174, it may also be formed in an N-Well. The latter generally results in a slightly lower breakdown voltage than the counter doping of NLDD region in the low voltage P-Well, due to the enhancing nature of the two n-type diffusions.

In some situations, zener diodes are not a desirable component of a triggering mechanism. As integrated circuit feature sizes shrink, the operational voltage and the breakdown voltage of the various transistors and junctions falls. Typical deep submicron devices operate from voltages at or below 2 volts. In such circuits, the doping density of the lightly doped diffusion regions is such that the breakdown voltage of zener diodes is below the critical zener voltage resulting in undesired leakage current due to band to band tunneling; thus rendering the use of zener diodes undesirable.

An alternative triggering mechanism comprises an npn transistor. FIG. 11 is an illustration of a cross section of an NMOS device incorporating a parasitic lateral npn transistor formed when a grounded gate MOS transistor is created. An N+ region 178 forms the collector of the npn transistor. A P-Well region 180 forms the base, and N+ region 182 forms the emitter. A P+ region 184 serves to ensure good electrical contact to P-Well 180. Gate 186, base 180, and emitter 182 are electrically coupled to a negative potential, and collector 178 is electrically coupled to a positive potential. As the collector to emitter voltage increases, a point is reached where the electric field at the base collector junction causes impact ionization. Any further increase in applied voltage (electric field) results in avalanche multiplication and a snap back from the Vcbo characteristic to the $Vce_{sus}$ characteristic, as is well know by those skilled in the art. The use of structure 1100 as a component in a triggering mechanism allows for trigger voltages below 6 volts with low leakage currents. One advantage of forming the npn transistor as described above and depicted in FIG. 11 is that it is compatible with the normal integrated circuit fabrication process, and requires no additional processing steps. The isolated P-Well 180 provides the additional advantage of preventing the shunting of the ionization generated hole current into the p-type substrate (p-type substrate not shown). Another advantage is that triggering structures can be placed in series if higher trigger voltages are required.

FIG. 12 is an equivalent circuit schematic illustrating an embodiment of a parasitic lateral npn transistor structure depicted in FIG. 11. The diagram in FIG. 12 indicates the location of the collector 178, base 180, emitter 182, and transistor gate 186. Resistance 179 represents parasitic resistance formed by P-Well region 180. When conduction occurs through the npn transistor, the breakdown current (i.e., the current through the emitter and base) flows into gate G1 of the SCR.

Figure 13:
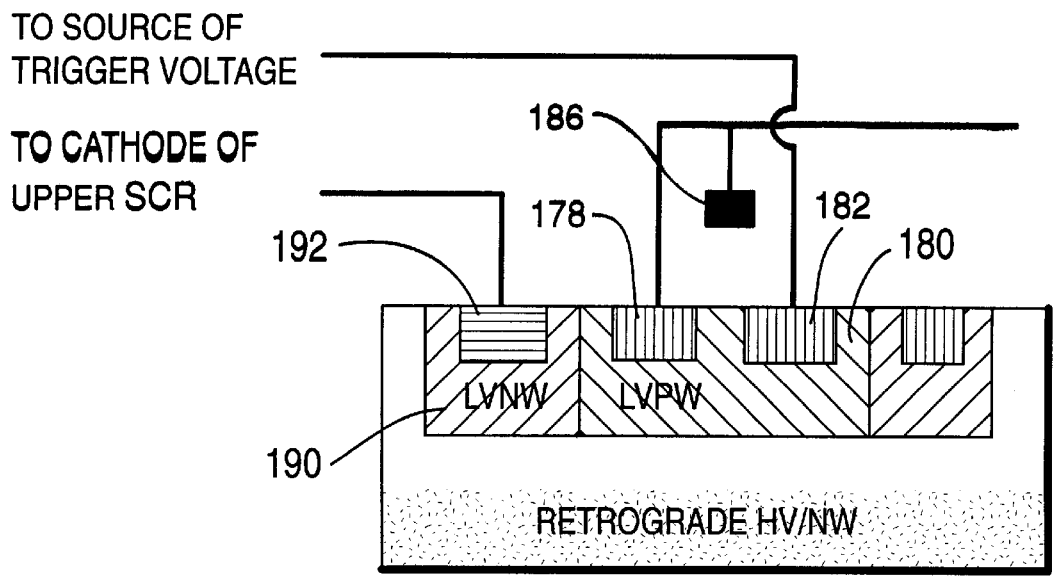
FIG. 13 is a cross sectional view illustrating the incorporation of a lateral npn transistor as a trigger into the stacked SCR structure.

FIG. 13 is a cross sectional view illustrating the incorporation of a lateral npn transistor into an SCR structure. Collector region 182 is electrically coupled to the source of the trigger voltage. Emitter 178 and gate 186 are electrically coupled to a source of negative reference potential. Emitter 178 also forms the cathode, and base region 180 also forms the G1 region of the SCR shown in the cross section in FIG. 13. Abutted N-Well 190, forms the G2 region and P+ region 192 forms the anode region.

Figure 14:
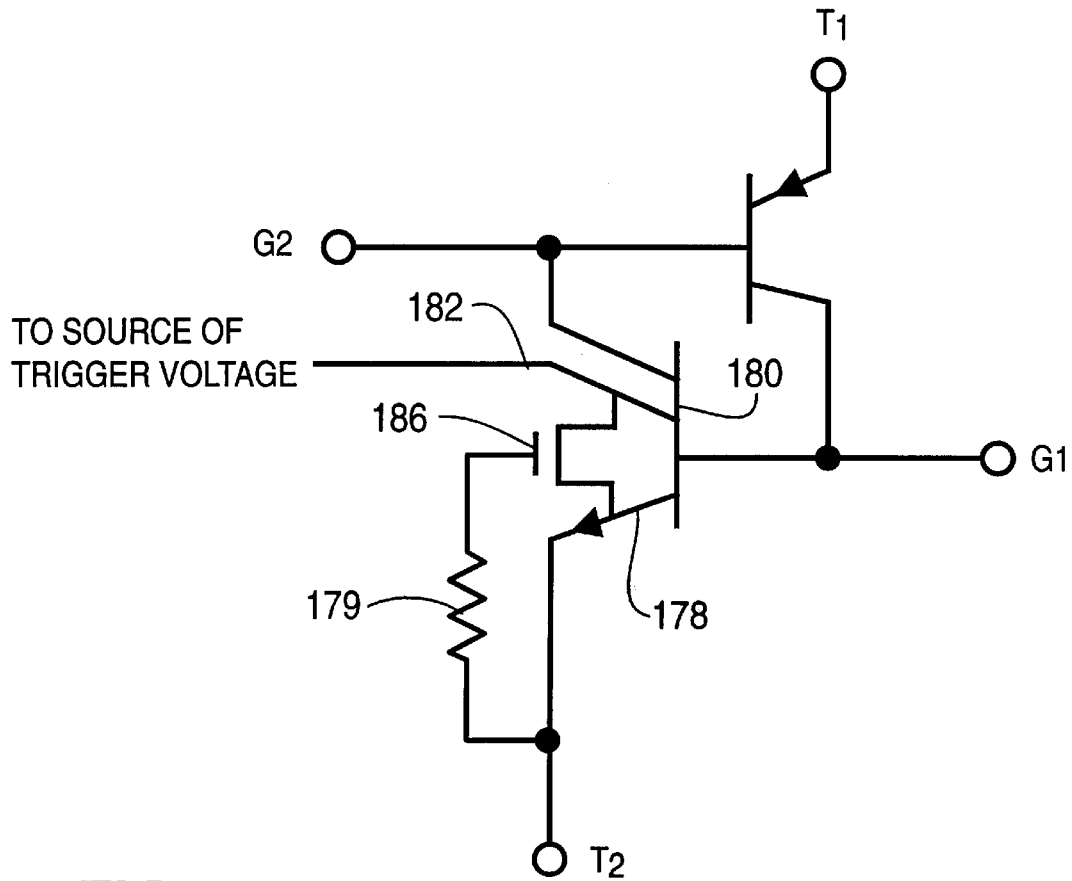
FIG. 14 is an equivalent schematic diagram illustrating an embodiment of the incorporation of a parasitic lateral npn transistor as shown in FIG. 11 into the SCR structure shown in FIG. 5.

FIG. 14 is an equivalent schematic diagram illustrating an embodiment of an SCR structure incorporating a parasitic lateral npn transistor. The electrical coupling of gate 186 to a source of negative potential biases gate 186 such that a depletion region of majority carriers is formed. The depletion region prevents the SCR structure from turning on. A trigger voltage of sufficient potential at collector 182 causes an influx of minority carriers, which causes the parasitic lateral npn transistor to conduct, thus turning the SCR structure on. In an alternate embodiment of the invention, the emitter of the parasitic lateral transistor is formed by at least one of the N+ regions that are interdigitated with P+ regions (as depicted in FIG. 4).

Although illustrated and described above with reference to certain specific embodiments, the present invention is nevertheless not intended to be limited to the details shown. Rather, various modifications may be made in the details within the scope and range of equivalents of the claims and without departing from the spirit of the invention. For example, the number of SCRs connected in series may be different, and the trigger mechanism may be connected to other gates, such as the G2 gate of the SCR connected to the positive source potential.

What is claimed is:

1. An electrostatic protection circuit comprising:
    a plurality, N, of silicon controlled rectifiers, ordinally marked first through Nth, having a first silicon controlled rectifier and a last silicon controlled rectifier, connected in series, forming a series connection having a first end and a second end, where N is an integer; wherein
    each silicon controlled rectifier has a first gate, a second gate, a cathode, and an anode; wherein the anode of the first silicon controlled rectifier is electrically coupled to the first end of the series connection and the cathode of the Nth silicon controlled rectifier is electrically coupled to the second end of the series connection,
    one of the first gate and the second gate of the Nth silicon controlled rectifier is electrically coupled to a triggering mechanism for activating the circuit; and
    at least one of the N−1 silicon controlled rectifiers other than The Nth silicon controlled rectifier, is biased, independent of any potential applied to its first or second gate, to be conducting when a potential between its anode and cathode is less than an ESD potential.

2. The circuit according to claim 1, wherein the triggering mechanism comprises:
    a resistance electrically coupled between the cathode and the first gate of the last silicon controlled rectifier; and
    a diode electrically coupled between the first gate of the last silicon controlled rectifier and the anode of the first silicon controlled rectifier.

3. The circuit according to claim 2, wherein the diode is selected from the group consisting of a zener diode, an avalanche diode, and a breakdown diode.

4. The circuit according to claim 2, wherein the resistance is an external discrete resistance.

5. The circuit according to claim 2, wherein the resistance is formed within the last silicon controlled rectifier.

6. The circuit according to claim 1, wherein the triggering mechanism comprises:
    a diode electrically coupled between the second gate and the cathode of the last silicon controlled rectifier.

7. The circuit according to claim 3, wherein the diode is selected from the group consisting of a zener diode, an avalanche diode, and a breakdown diode.

8. The circuit according to claim 1 wherein the triggering mechanism comprises a parasitic lateral npn transistor, having an emitter, a first collector, a second collector, a gate, and a base, wherein:

the first collector of the npn transistor is electrically coupled to the second gate of the last silicon controlled rectifier, the emitter of the npn transistor is electrically coupled to the cathode of the last silicon controlled rectifier, the base of the npn transistor is electrically coupled to the first gate of the last silicon controlled rectifier; and the second collector of the npn transistor is electrically connected to a source of triggering voltage.

9. The circuit according to claim 1, wherein the first gate of the at least one of the N−1 silicon controlled rectifiers is electrically coupled to its second gate.

10. The circuit according to claim 1 wherein the second gate of the at least one of the N−1 silicon controlled rectifiers is electrically coupled to its cathode.

11. The circuit according to claim 1 wherein the first gate of the at least one of the N−1 silicon controlled rectifiers is electrically coupled to its anode.

12. The circuit according to claim 1 wherein the at least one of the N−1 silicon controlled rectifiers further comprises a metal oxide semiconductor transistor having its anode as a source, its first gate as a drain, and a gate electrode electrically coupled to its cathode.

13. The circuit according to claim 1 wherein the at least one of the N−1 silicon controlled rectifiers further comprises a metal oxide semiconductor transistor having its cathode as a source, its second gate as a drain, and a gate electrode electrically coupled to its anode.

14. The circuit according to claim 1 wherein the at least one of the N−1 silicon controlled rectifiers further comprises:

a first metal oxide semiconductor device having its anode as a source, its first gate as a drain, and a common gate electrode;

a second metal oxide semiconductor device having its cathode as its source, its second gate as its drain, and said common gate electrode, said common gate electrode being electrically coupled to its cathode.

15. The circuit according to claims 1 wherein the at least one of the N−1 silicon controlled rectifiers further comprises:

a first metal oxide semiconductor device having its anode as a source, its first gate as a drain, and a common gate electrode;

a second metal oxide semiconductor device having its cathode as a source, its second gate as a drain, and said common gate electrode, said common gate electrode being electrically coupled to its anode.

16. An electrostatic protection circuit comprising:

a plurality of silicon controlled rectifiers, having a first silicon controlled rectifier and a last silicon controlled rectifier, connected in series, forming a series connection having a first end and a second end; wherein each silicon controlled rectifier has a first gate, a second gate, a cathode, and an anode; wherein the anode of the first silicon controlled rectifier is electrically coupled to the first end of the series connection and the cathode of the last silicon controlled rectifier is electrically coupled to the second end of The series connection;

the first gate of each silicon controlled rectifier in the series connection is electrically coupled to its second gate, but not to any source of operating potential or to any reference potential, for all silicon controlled rectifiers except the first silicon controlled rectifier;

a triggering mechanism comprising:

a diode electrically coupled to the cathode of the last silicon controlled rectifier and the second gate of the first silicon controller rectifier, and a resistor electrically coupled to the anode of the first silicon controller rectifier and the second gate of the first silicon controller rectifier.

17. The circuit according to claim 16, wherein the diode is selected from the group consisting of a zener diode, an avalanche diode, and a breakdown diode.

18. An electrostatic protection circuit comprising:

a plurality of silicon controlled rectifiers, having a first silicon controlled rectifier and a last silicon controlled rectifier, connected in series, forming a series connection having a first end and a second end; wherein each silicon controlled rectifier has a first gate, a second gate, a cathode, and an anode; wherein the anode of the first silicon controlled rectifier is electrically coupled to the first end of the series connection and the cathode of the last silicon controlled rectifier is electrically coupled to the second end of the series connection, one of the first gate and the second gate of the last silicon controlled rectifier is electrically coupled to a triggering mechanism for activating the circuit; and the first and second gates of each silicon controlled rectifier in the series connection are unconnected for all silicon controlled rectifiers except the last silicon controlled rectifier.

19. The circuit according to claim 18, wherein the triggering mechanism comprises:

a resistance electrically coupled between the cathode and the first gate of the last silicon controlled rectifier; and a diode electrically coupled between the first gate of the last silicon controlled rectifier and the anode of the first silicon controlled rectifier.

20. The circuit according to claim 18, wherein the triggering mechanism comprises:

a resistance coupled between the anode and the second gate of the last silicon controlled rectifier, and a diode electrically coupled between the second gate and the cathode of the last silicon controlled rectifier.

21. The circuit according to claim 19, wherein the diode is selected from the group consisting of a zener diode, an avalanche diode, and a breakdown diode.

22. The circuit according to claim 19, wherein the resistance is an external discrete resistance.

23. The circuit according to claim 19, wherein the resistance is formed within the last silicon controlled rectifier.

24. The circuit according to claim 18 wherein the triggering mechanism comprises a parasitic lateral npn transistor, having an emitter, a first collector, a second collector and a base, wherein the first collector of the npn transistor is electrically coupled to the second gate of the last silicon controlled rectifier, the emitter of the npn transistor is electrically coupled to the cathode of the last silicon controlled rectifier, the base of the npn transistor is electrically coupled to the first gate of the last silicon controlled rectifier; and the second collector of the npn transistor is electrically coupled to a voltage source for the triggering mechanism.

25. An electrostatic protection circuit comprising:
a plurality, N, of silicon controlled rectifiers, ordinally numbered first through Nth, having a first silicon controlled rectifier and an Nth silicon controlled rectifier, connected in series, forming a series connection having a first end and a second end, where N is an integer; wherein
 each silicon controlled rectifier has a first gate, a second gate, a cathode, and an anode; wherein the anode of the first silicon controlled rectifier is electrically coupled to the first end of the series connection and the cathode of the Nth silicon controlled rectifier is electrically coupled to the second end of the series connection,
 the second gate of the Nth silicon controlled rectifier is electrically coupled to a triggering mechanism for activating the circuit, wherein the triggering mechanism comprises:
  a resistance electrically coupled between the anode and the second gate of the Nth silicon controlled rectifier, and
  a diode coupled between the cathode and the second gate of the Nth silicon controlled rectifier; and
 at least one of the N−1 silicon controlled rectifiers other than the Nth silicon controlled rectifier, is biased, independent of any potential applied to its first or second gate, to be conducting when a potential between its anode and cathode is less than an ESD potential.

* * * * *